(12) United States Patent
Kosowsky et al.

(10) Patent No.: US 8,968,606 B2
(45) Date of Patent: Mar. 3, 2015

(54) COMPONENTS HAVING VOLTAGE SWITCHABLE DIELECTRIC MATERIALS

(75) Inventors: Lex Kosowsky, San Jose, CA (US); Bhret Graydon, San Jose, CA (US); Robert Fleming, San Jose, CA (US)

(73) Assignee: Littelfuse, Inc., Chicago, IL (US)

( * ) Notice: Subject to any disclaimer, the term of this patent is extended or adjusted under 35 U.S.C. 154(b) by 690 days.

(21) Appl. No.: 12/731,557

(22) Filed: Mar. 25, 2010

(65) Prior Publication Data

US 2010/0243302 A1 Sep. 30, 2010

Related U.S. Application Data

(60) Provisional application No. 61/163,842, filed on Mar. 26, 2009.

(51) Int. Cl.
| | | |
|---|---|---|
| H01B 1/22 | (2006.01) | |
| H01L 23/62 | (2006.01) | |
| H01C 7/12 | (2006.01) | |
| H05K 1/02 | (2006.01) | |
| H01C 1/142 | (2006.01) | |
| H01C 1/148 | (2006.01) | |
| H01C 7/10 | (2006.01) | |
| H05K 1/03 | (2006.01) | |
| H05K 1/16 | (2006.01) | |

(52) U.S. Cl.
CPC .............. *H05K 1/0257* (2013.01); *H01C 1/142* (2013.01); *H01C 1/148* (2013.01); *H01C 7/1006* (2013.01); *H05K 1/0259* (2013.01); *H05K 1/0373* (2013.01); *H05K 1/167* (2013.01); *H05K 2201/0738* (2013.01)
USPC .............. 252/512; 174/256; 338/21; 257/355

(58) Field of Classification Search
CPC ............ H01B 1/20–1/24; H01L 23/62; H05K 2201/0738; H05K 1/0259; H01C 7/12; H01R 13/6666
USPC ............. 252/512–514; 174/250–257; 338/21; 257/355; 361/91.1
See application file for complete search history.

(56) References Cited

U.S. PATENT DOCUMENTS 3,347,724 A 10/1967 Schneble, Jr. et al.
3,685,026 A 8/1972 Wakabayashi et al.
(Continued)

FOREIGN PATENT DOCUMENTS

AU WO 8906589 A1 7/1989
CH 663491 A5 12/1987
(Continued)

OTHER PUBLICATIONS

Breton et al., "Mechanical properties of multiwall carbon nanotubes/epoxy composites: influence of network morphology," Carbon Elsevier UK, vol. 42, No. 5-6, pp. 1027-1030 (2004).
(Continued)

*Primary Examiner* — Mark Kopec
(74) *Attorney, Agent, or Firm* — Kacvinsky Daisak Bluni PLLC

(57) ABSTRACT

Various aspects provide for structures and devices to protect against spurious electrical events (e.g., electrostatic discharge). Some embodiments incorporate a voltage switchable dielectric material (VSDM) bridging a gap between two conductive pads. Normally insulating, the VSDM may conduct current from one pad to the other during a spurious electrical event (e.g., shunting current to ground). Some aspects include gaps having a gap width that is greater than 50% of a spacing between electrical leads connected to the pads. Some devices include single layers of VSDM. Some devices include multiple layers of VSDM. Various devices may be designed to increase a ratio of active volume (of VSDM) to inactive volume.

22 Claims, 8 Drawing Sheets

(56) References Cited

U.S. PATENT DOCUMENTS

| | | |
|---|---|---|
| 3,685,028 A | 8/1972 | Wakabayashi et al. |
| 3,723,635 A | 3/1973 | Smith |
| 3,808,576 A | 4/1974 | Castonguay et al. |
| 3,926,916 A | 12/1975 | Mastrangelo |
| 3,977,957 A | 8/1976 | Kosowsky et al. |
| 4,113,899 A | 9/1978 | Henry et al. |
| 4,133,735 A | 1/1979 | Afromowitz et al. |
| 4,252,692 A | 2/1981 | Taylor et al. |
| 4,269,672 A | 5/1981 | Inoue |
| 4,331,948 A | 5/1982 | Malinaric et al. |
| 4,359,414 A | 11/1982 | Mastrangelo |
| 4,405,432 A | 9/1983 | Kosowsky |
| 4,439,809 A | 3/1984 | Weight et al. |
| 4,506,285 A | 3/1985 | Einzinger |
| 4,591,411 A | 5/1986 | Reimann |
| 4,642,160 A | 2/1987 | Burgess |
| 4,702,860 A | 10/1987 | Kinderov et al. |
| 4,714,952 A | 12/1987 | Takekawa et al. |
| 4,726,877 A | 2/1988 | Fryd et al. |
| 4,726,991 A | 2/1988 | Hyatt et al. |
| 4,799,128 A | 1/1989 | Chen |
| 4,888,574 A | 12/1989 | Rice et al. |
| 4,892,776 A | 1/1990 | Rice |
| 4,918,033 A | 4/1990 | Bartha et al. |
| 4,928,199 A | 5/1990 | Diaz et al. |
| 4,935,584 A | 6/1990 | Boggs |
| 4,977,357 A | 12/1990 | Shrier |
| 4,992,333 A | 2/1991 | Hyatt |
| 4,996,945 A | 3/1991 | Dix, Jr. |
| 5,068,634 A | 11/1991 | Shrier |
| 5,092,032 A | 3/1992 | Murakami |
| 5,095,626 A | 3/1992 | Kitamura et al. |
| 5,099,380 A | 3/1992 | Childers et al. |
| 5,142,263 A | 8/1992 | Childers et al. |
| 5,148,355 A | 9/1992 | Lowe et al. |
| 5,167,778 A | 12/1992 | Kaneko et al. |
| 5,183,698 A | 2/1993 | Stephenson et al. |
| 5,189,387 A | 2/1993 | Childers et al. |
| 5,246,388 A | 9/1993 | Collins et al. |
| 5,248,517 A | 9/1993 | Shrier et al. |
| 5,252,195 A | 10/1993 | Kobayashi et al. |
| 5,260,848 A | 11/1993 | Childers |
| 5,262,754 A | 11/1993 | Collins |
| 5,278,535 A | 1/1994 | Xu et al. |
| 5,282,312 A | 2/1994 | DiStefano et al. |
| 5,294,374 A | 3/1994 | Martinez et al. |
| 5,295,297 A | 3/1994 | Kitamura et al. |
| 5,300,208 A | 4/1994 | Angelopoulos et al. |
| 5,317,801 A | 6/1994 | Tanaka et al. |
| 5,340,641 A | 8/1994 | Xu |
| 5,347,258 A | 9/1994 | Howard et al. |
| 5,354,712 A | 10/1994 | Ho et al. |
| 5,367,764 A | 11/1994 | DiStefano et al. |
| 5,378,858 A | 1/1995 | Bruckner et al. |
| 5,380,679 A | 1/1995 | Kano |
| 5,393,597 A | 2/1995 | Childers et al. |
| 5,403,208 A | 4/1995 | Felcman et al. |
| 5,404,637 A | 4/1995 | Kawakami |
| 5,413,694 A | 5/1995 | Dixon et al. |
| 5,416,662 A | 5/1995 | Kurasawa et al. |
| 5,440,075 A | 8/1995 | Kawakita et al. |
| 5,444,593 A | 8/1995 | Allina |
| 5,476,471 A | 12/1995 | Shifrin et al. |
| 5,481,795 A | 1/1996 | Hatakeyama et al. |
| 5,483,407 A | 1/1996 | Anastasio et al. |
| 5,487,218 A | 1/1996 | Bhatt et al. |
| 5,493,146 A | 2/1996 | Pramanik et al. |
| 5,501,350 A | 3/1996 | Yoshida et al. |
| 5,502,889 A | 4/1996 | Casson et al. |
| 5,510,629 A | 4/1996 | Karpovich et al. |
| 5,550,400 A | 8/1996 | Takagi et al. |
| 5,557,136 A | 9/1996 | Gordon et al. |
| 5,654,564 A | 8/1997 | Mohsen |
| 5,669,381 A | 9/1997 | Hyatt |
| 5,685,070 A | 11/1997 | Alpaugh et al. |
| 5,708,298 A | 1/1998 | Masayuki et al. |
| 5,714,794 A | 2/1998 | Tsuyama et al. |
| 5,734,188 A | 3/1998 | Murata et al. |
| 5,744,759 A | 4/1998 | Ameen et al. |
| 5,781,395 A | 7/1998 | Hyatt |
| 5,802,714 A | 9/1998 | Kobayashi et al. |
| 5,807,509 A | 9/1998 | Shrier et al. |
| 5,808,351 A | 9/1998 | Nathan et al. |
| 5,834,160 A | 11/1998 | Ferry et al. |
| 5,834,824 A | 11/1998 | Shepherd et al. |
| 5,834,893 A | 11/1998 | Bulovic et al. |
| 5,848,467 A | 12/1998 | Khandros et al. |
| 5,856,910 A | 1/1999 | Yurchenko et al. |
| 5,865,934 A | 2/1999 | Yamamoto et al. |
| 5,869,869 A | 2/1999 | Hively |
| 5,874,902 A | 2/1999 | Heinrich et al. |
| 5,906,042 A | 5/1999 | Lan et al. |
| 5,910,685 A | 6/1999 | Watanabe et al. |
| 5,926,951 A | 7/1999 | Khandros et al. |
| 5,940,683 A | 8/1999 | Holm et al. |
| 5,946,555 A | 8/1999 | Crumly et al. |
| 5,955,762 A | 9/1999 | Hively |
| 5,956,612 A | 9/1999 | Elliott et al. |
| 5,962,815 A | 10/1999 | Lan et al. |
| 5,970,321 A | 10/1999 | Hively |
| 5,972,192 A | 10/1999 | Dubin et al. |
| 5,977,489 A | 11/1999 | Crotzer et al. |
| 6,013,358 A | 1/2000 | Winnett et al. |
| 6,023,028 A | 2/2000 | Neuhalfen |
| 6,064,094 A | 5/2000 | Intrater et al. |
| 6,108,184 A | 8/2000 | Minervini et al. |
| 6,114,672 A | 9/2000 | Iwasaki |
| 6,130,459 A | 10/2000 | Intrater |
| 6,160,695 A | 12/2000 | Winnett et al. |
| 6,172,590 B1 | 1/2001 | Shrier et al. |
| 6,184,280 B1 | 2/2001 | Shibuta |
| 6,191,928 B1 * | 2/2001 | Rector et al. ............... 361/127 |
| 6,198,392 B1 | 3/2001 | Hahn et al. |
| 6,211,554 B1 | 4/2001 | Whitney et al. |
| 6,239,687 B1 | 5/2001 | Shrier et al. |
| 6,251,513 B1 | 6/2001 | Rector et al. |
| 6,310,752 B1 | 10/2001 | Shrier et al. |
| 6,316,734 B1 | 11/2001 | Yang |
| 6,340,789 B1 | 1/2002 | Petritsch et al. |
| 6,351,011 B1 | 2/2002 | Whitney et al. |
| 6,373,719 B1 | 4/2002 | Behling et al. |
| 6,407,411 B1 | 6/2002 | Wojnarowski |
| 6,433,394 B1 * | 8/2002 | Intrater ....................... 257/355 |
| 6,448,900 B1 | 9/2002 | Chen |
| 6,455,916 B1 | 9/2002 | Robinson |
| 6,468,593 B1 | 10/2002 | Iazawa |
| 6,512,458 B1 | 1/2003 | Kobayashi et al. |
| 6,534,422 B1 | 3/2003 | Ichikawa et al. |
| 6,542,065 B2 | 4/2003 | Shrier et al. |
| 6,549,114 B2 | 4/2003 | Whitney et al. |
| 6,570,765 B2 | 5/2003 | Behling et al. |
| 6,593,597 B2 | 7/2003 | Sheu |
| 6,621,172 B2 | 9/2003 | Nakayama |
| 6,628,498 B2 | 9/2003 | Whitney et al. |
| 6,642,297 B1 | 11/2003 | Hyatt et al. |
| 6,657,532 B1 | 12/2003 | Shrier et al. |
| 6,677,183 B2 | 1/2004 | Sakaguchi et al. |
| 6,693,508 B2 | 2/2004 | Whitney et al. |
| 6,709,944 B1 | 3/2004 | Durocher et al. |
| 6,741,217 B2 | 5/2004 | Toncich et al. |
| 6,797,145 B2 | 9/2004 | Kosowsky |
| 6,882,051 B2 | 4/2005 | Majumdar et al. |
| 6,903,175 B2 | 6/2005 | Gore et al. |
| 6,911,676 B2 | 6/2005 | Yoo |
| 6,916,872 B2 | 7/2005 | Yadav et al. |
| 6,981,319 B2 | 1/2006 | Shrier |
| 7,034,652 B2 * | 4/2006 | Whitney et al. ............ 338/223 |
| 7,049,926 B2 | 5/2006 | Shrier et al. |
| 7,053,468 B2 | 5/2006 | Lee |
| 7,064,353 B2 | 6/2006 | Bhat |
| 7,067,840 B2 | 6/2006 | Klauk |
| 7,132,697 B2 | 11/2006 | Weimer et al. |
| 7,132,922 B2 | 11/2006 | Harris et al. |
| 7,141,184 B2 | 11/2006 | Chacko et al. |

(56) References Cited

U.S. PATENT DOCUMENTS

| | | |
|---|---|---|
| 7,173,288 B2 | 2/2007 | Lee et al. |
| 7,183,891 B2 | 2/2007 | Harris et al. |
| 7,202,770 B2 | 4/2007 | Harris et al. |
| 7,205,613 B2 | 4/2007 | Fjelstad et al. |
| 7,218,492 B2 | 5/2007 | Shrier |
| 7,279,724 B2 | 10/2007 | Collins et al. |
| 7,320,762 B2 | 1/2008 | Greuter et al. |
| 7,341,824 B2 | 3/2008 | Sexton |
| 7,417,194 B2 | 8/2008 | Shrier |
| 7,446,030 B2 | 11/2008 | Kosowsky |
| 7,488,625 B2 | 2/2009 | Knall |
| 7,492,504 B2 | 2/2009 | Chopra et al. |
| 7,528,467 B2 | 5/2009 | Lee |
| 7,535,462 B2 | 5/2009 | Spath et al. |
| 7,585,434 B2 | 9/2009 | Morita |
| 7,593,203 B2 | 9/2009 | Dudnikov, Jr. et al. |
| 7,609,141 B2 | 10/2009 | Harris |
| 7,872,251 B2 | 1/2011 | Kosowsky et al. |
| 7,923,844 B2 | 4/2011 | Kosowsky |
| 8,421,582 B2 * | 4/2013 | Hiehata et al. ............. 338/20 |
| 2002/0004258 A1 | 1/2002 | Nakayama et al. |
| 2002/0050912 A1 | 5/2002 | Shrier et al. |
| 2002/0061363 A1 | 5/2002 | Halas et al. |
| 2003/0010960 A1 | 1/2003 | Greuter et al. |
| 2003/0025587 A1 * | 2/2003 | Whitney et al. ............. 338/22 R |
| 2003/0079910 A1 | 5/2003 | Kosowsky |
| 2003/0151029 A1 | 8/2003 | Hsu |
| 2003/0218851 A1 | 11/2003 | Harris et al. |
| 2004/0000725 A1 | 1/2004 | Lee |
| 2004/0062041 A1 | 4/2004 | Cross et al. |
| 2004/0063839 A1 | 4/2004 | Kawate et al. |
| 2004/0095658 A1 | 5/2004 | Buretea et al. |
| 2004/0154828 A1 | 8/2004 | Moller et al. |
| 2004/0160300 A1 | 8/2004 | Shrier |
| 2004/0201941 A1 | 10/2004 | Harris |
| 2004/0211942 A1 | 10/2004 | Clark et al. |
| 2004/0241894 A1 | 12/2004 | Nagai et al. |
| 2004/0262583 A1 | 12/2004 | Lee |
| 2005/0026334 A1 | 2/2005 | Knall |
| 2005/0039949 A1 | 2/2005 | Kosowsky |
| 2005/0057867 A1 * | 3/2005 | Harris et al. ............. 361/56 |
| 2005/0083163 A1 | 4/2005 | Shrier |
| 2005/0106098 A1 | 5/2005 | Tsang et al. |
| 2005/0121653 A1 | 6/2005 | Chacko |
| 2005/0184387 A1 | 8/2005 | Collins et al. |
| 2005/0218380 A1 | 10/2005 | Gramespacher et al. |
| 2005/0255631 A1 | 11/2005 | Bureau et al. |
| 2005/0274455 A1 | 12/2005 | Extrand |
| 2005/0274956 A1 | 12/2005 | Bhat |
| 2005/0275070 A1 | 12/2005 | Hollingsworth |
| 2006/0060880 A1 | 3/2006 | Lee et al. |
| 2006/0142455 A1 | 6/2006 | Agarwal |
| 2006/0152334 A1 | 7/2006 | Maercklein et al. |
| 2006/0166474 A1 | 7/2006 | Vereecken et al. |
| 2006/0167139 A1 | 7/2006 | Nelson et al. |
| 2006/0181826 A1 | 8/2006 | Dudnikov, Jr. et al. |
| 2006/0181827 A1 | 8/2006 | Dudnikov, Jr. et al. |
| 2006/0193093 A1 | 8/2006 | Bertin |
| 2006/0199390 A1 | 9/2006 | Dudnikov, Jr. et al. |
| 2006/0211837 A1 | 9/2006 | Ko et al. |
| 2006/0214156 A1 | 9/2006 | Pan et al. |
| 2006/0234127 A1 | 10/2006 | Kim |
| 2006/0291127 A1 | 12/2006 | Kim et al. |
| 2007/0114640 A1 | 5/2007 | Kosowsky |
| 2007/0116976 A1 | 5/2007 | Tan et al. |
| 2007/0123625 A1 | 5/2007 | Dorade et al. |
| 2007/0139848 A1 | 6/2007 | Harris et al. |
| 2007/0146941 A1 | 6/2007 | Harris et al. |
| 2007/0208243 A1 | 9/2007 | Gabriel et al. |
| 2007/0241458 A1 | 10/2007 | Ding et al. |
| 2008/0045770 A1 | 2/2008 | Sigmund et al. |
| 2008/0047930 A1 | 2/2008 | Blanchet et al. |
| 2008/0073114 A1 | 3/2008 | Kosowsky et al. |
| 2008/0144355 A1 | 6/2008 | Boeve et al. |
| 2008/0278873 A1 | 11/2008 | Leduc et al. |
| 2009/0044970 A1 | 2/2009 | Kosowsky |
| 2009/0309074 A1 | 12/2009 | Chen et al. |
| 2010/0038119 A1 | 2/2010 | Kosowsky |
| 2010/0038121 A1 | 2/2010 | Kosowsky |
| 2010/0040896 A1 | 2/2010 | Kosowsky |
| 2010/0044079 A1 | 2/2010 | Kosowsky |
| 2010/0044080 A1 | 2/2010 | Kosowsky |
| 2010/0187006 A1 | 7/2010 | Kosowsky et al. |
| 2010/0270588 A1 | 10/2010 | Kosowsky et al. |
| 2011/0061230 A1 | 3/2011 | Kosowsky |
| 2011/0062388 A1 | 3/2011 | Kosowsky et al. |

FOREIGN PATENT DOCUMENTS

| | | |
|---|---|---|
| DE | 3040784 A1 | 5/1982 |
| DE | 10115333 A1 | 1/2002 |
| DE | 102004049053 | 5/2005 |
| DE | 102006047377 | 4/2008 |
| EP | 0790758 A1 | 8/1997 |
| EP | 1003229 A1 | 5/2000 |
| EP | 1245586 A2 | 10/2002 |
| EP | 1542240 A2 | 6/2005 |
| EP | 1580809 A2 | 9/2005 |
| EP | 1990834 A2 | 11/2008 |
| JP | 56091464 A | 7/1981 |
| JP | 63 195275 A | 8/1988 |
| JP | 2000062076 A | 2/2002 |
| KR | WO 2005100426 A1 | 10/2005 |
| WO | WO8906859 A2 | 7/1989 |
| WO | WO9602922 A2 | 2/1996 |
| WO | WO9602924 A1 | 2/1996 |
| WO | WO9726665 A1 | 7/1997 |
| WO | WO9823018 A1 | 5/1998 |
| WO | WO9924992 A1 | 5/1999 |
| WO | WO02103085 A1 | 12/2002 |
| WO | WO2006130366 A2 | 12/2006 |
| WO | WO2007062170 A2 | 5/2007 |
| WO | WO2007062171 A2 | 5/2007 |
| WO | WO2008016858 A1 | 2/2008 |
| WO | WO2008016859 A1 | 2/2008 |
| WO | WO20081535847 A1 | 12/2008 |

OTHER PUBLICATIONS

Celzard, A., et al., "Conduction Mechanisms in Some Graphite-polymer Composites: The Effect of a Direct-current Electric Field", Journal of Physics: Condensed Matter, 9 (1997) pp. 2225-2237.

Facchetti, Antonio, "Semiconductors for Organic Transistors", Materials Today, vol. 10, No. 3, pp. 28-37.

Granstrom et al., "laminated fabrication of polymeric photovoltaic diodes," Nature, vol. 395, pp. 257-260 (1998).

Guo et al., "Block Copolymer Modified Novolac Epoxy Resin," Polymer Physics, vol. 41, No. 17, pp. 1994-2003 (2003).

Levinson et al. "The Physics of Metal Oxide Varistors," J. App. Phys. 46 (3): 1332-1341 (1975).

Modine, F.A. and Hyatt, H.M. "New Varistor Material", Journal of Applied Physics, 64 (8), Oct. 15, 1988, pp. 4229-4232.

Onoda et al., "Photoinduced Charge Transfer of Conducting Polymer Compositions," IEICE Trans. Electronics, vol. E81-C(7), pp. 1051-1056 (1998).

Raffaelle et al., "Nanomaterial Development for Polymeric Solar Cells," IEEE 4th World Conf on Photovoltaic energy Conversion, pp. 186-189 (2006).

Reese, Colin and Bao, Zhenan, "Organic Single-Crystal Field-Effect Transistors", Materials Today, vol. 10, No. 3, pp. 20-27.

Saunders et al., "Nanoparticle-polymer photovoltaic cells," Adv. Colloid Int. Sci., vol. 138, No. 1, pp. 1-23 (2007).

Wikipedia article for "Fullerene chemistry" as originally published on Apr. 8, 2010. http://en.wikipedia.org/wiki/Fullerene_chemistry.

* cited by examiner

COMPONENTS HAVING VOLTAGE SWITCHABLE DIELECTRIC MATERIALS

CROSS REFERENCE TO RELATED APPLICATIONS

This application claims the priority benefit of U.S. provisional patent application No. 61/163,842, filed Mar. 26, 2009 and entitled "Discrete Component for Handling Transient Electrical Events Using Voltage Switchable Dielectric Material," the disclosure of which is incorporated by reference herein.

BACKGROUND

1. Technical Field

The present invention relates to designing and fabricating devices that incorporate voltage switchable dielectric materials.

2. Description of Related Art

A printed circuit board, printed wiring board, integrated circuit (IC) package, or similar substrate (hereinafter, PCB) may be used to assemble and connect electronic components. A PCB typically includes a dielectric material and one or more conductive leads to provide electrical conductivity among various attached components, chips, and the like. Leads may be metallic, and are often formed using lithographic techniques (e.g., as a layer of Cu which is subsequently etched)

Various components may be attached to a PCB. Attachment may include soldering (e.g., reflowing), wire bonding, ultrasonic bonding, and the like. For applications requiring the attachment of several components to a PCB, the available "attachment area" on a surface of the PCB may limit the size and/or number of components that may be attached. Reducing the size of (and thus the surface area occupied by) an attached component may yield increased remaining area on the PCB surface, which may be used for attaching further components or larger components.

Various electrical and electronic components may benefit from surge protection, protection against electrostatic discharge (ESD) and protection against other spurious electrical events. ESD protection may include incorporating a voltage switchable dielectric material (VSDM). A VSDM may behave as an insulator at a low voltage, and a conductor at a higher voltage. A VSDM may be characterized by a so-called "switching voltage" between these states of low and high conductivity. A VSDM may shunt (e.g., to a ground) current that would otherwise damage a component by becoming conductive at voltages above the switching voltage and allowing currents at these voltages to pass to ground through the VSDM, rather than through the device being protected.

Some PCB components may be protected against electrical surges by attaching a surge protection device (e.g., a device incorporating a VSDM). In such cases, an attached surge-protection device may take up "attachable" regions (e.g., surface area) of the assembly. In such cases, minimizing the area of the device (while meeting requisite properties) may increase the available area for attachment of other components and/or minimize the overall size of the PCB assembly.

SUMMARY OF THE INVENTION

Various aspects provide for a device incorporating a voltage switchable dielectric material (VSDM). A VSDM may include a substantially insulating phase (e.g., one or more polymers) and a substantially conductive phase (e.g., one or more metals). A VSDM may include a semiconducting phase. In some implementations, an insulating phase may be substantially continuous, with discrete conductive and/or semiconducting phases (e.g., metallic and semiconducting particles dispersed in a polymer matrix at a concentration near a percolation threshold associated with the particles).

The device may include first and second conductive leads, which may be separated by a distance described as a "package spacing." The first lead may be connected to or otherwise in electrical communication with a first conductive pad, and the second lead may be connected or otherwise in electrical communication with a second conductive pad. The first and second pads may be separated by a first gap. The first gap may have a gap width greater than 50% 70%, or even 90% of the package spacing. The first gap may be larger than (e.g., 2 times, 3 times, 5 times, 10 times, 50 times, or even 100 times larger than) the package spacing. The first and second pads may be attached to the VSDM, and the first gap may be bridged by the VSDM, such that at voltages above the switching voltage, current may pass from one pad to the other via the VSDM, substantially "across" the first gap.

Certain embodiments include multilayer stacks of single layer devices (e.g., pairs of complementary pads on different layers). In some cases, a third conductive pad may be electrically connected to the first lead with a via (e.g., through a multilayer stack), and a fourth conductive pad may be electrically connected to the second lead with a via. A second VSDM (which may be different or the same as the first VSDM) may contact both the third and fourth pads, and may bridge a second gap separating the third and fourth pads. The first and second gaps may be the same or different. Some gaps may be fabricated using lithographic methods, which may provide for tightly controlled dimensional tolerance on the gap as compared to other fabrication methods.

Various embodiments include surface mount devices, which may be compatible with standard surface mount technology (SMT) specifications. In some cases, a package spacing may correspond to a standardized specification for an assembly to which the device may be attached (e.g., a bond pad spacing on a PCB). Typical package spacings may be between hundreds of microns and tens of millimeters. Some devices include dielectric substrates (e.g., printed circuit board substrates).

Some embodiments provide for a plurality of gaps between two pads. Some embodiments provide for a plurality of gaps between more than two pads. Pads connected by a VSDM may be disposed single layer. Pads connected by a VSDM may be disposed on different layers of a multilayer stack. In some cases, several pads are electrically connected to a single lead (e.g., a lead configured to be attached to ground). In some cases, a device may protect several different components, each of which may be attached to a separate lead in electrical communication with a pad. The pad may be separated from another pad (e.g., a ground pad) by a gap, and the gap may be bridged by VSDM, such that during an ESD event, current flows from one pad to the other via the VSDM, substantially across the gap.

DETAILED DESCRIPTION OF THE INVENTION

Methods and apparatus may be directed toward protecting against spurious electrical events (e.g., ESD). Some devices may be designed to attach to an assembly (e.g., a PCB), protecting electronic components of the assembly that are in electrical communication with the device. For example, a component may be connected to ground via the ESD protection device, which may shunt current to ground during an ESD event but otherwise insulate the component from ground. Devices may be designed according to one or more specifications (e.g., a distance between electrical leads, solder points, wire bond points, and the like), which may be defined by or associated with an assembly to which the device may be attached.

Various embodiments provide for devices having a wide range of sizes (e.g., from below 0.5 mm^2 area to several cm^2 area). For convenience, a size of certain features (e.g., a gap width) may be described in the context of a spacing that characterizes the approximate size of a device. For the purposes of this specification, a package spacing may describe such a size of a device. A package spacing may be a generic description of a spacing between electrical leads, which may be chosen to match a corresponding spacing on another object (e.g., a package to which the device may be attached, such as a distance between bond pads on a PCB). This description is not intended to limit package spacings to packaging per se, but to provide a size scale associated with a device. A package spacing may describe a specified distance. A package spacing may qualitatively describe an approximate size of a device. Some embodiments may be directed toward small devices (e.g., having a package spacing below 1 mm). Some embodiments may be directed toward larger devices (e.g., having a package spacing above 1 cm, or even above 10 cm).

Two conductive pads may be separated by a gap and connected by voltage switchable dielectric material (VSDM), through which current passes during an electrical event. The gap may include a gap width, and the VSDM may include an active volume. Various embodiments provide for optimizing the gap width and/or active volume according to various design specifications (e.g., according to a package to which the device may be attached). For example, an embodiment may maximize gap width subject to a leakage current limitation, a maximum desired clamp voltage, and a maximum volume of the device. Certain embodiments minimize clamp voltage and size of the device by maximizing a ratio of active volume to inactive volume of VSDM.

Figure 1A:
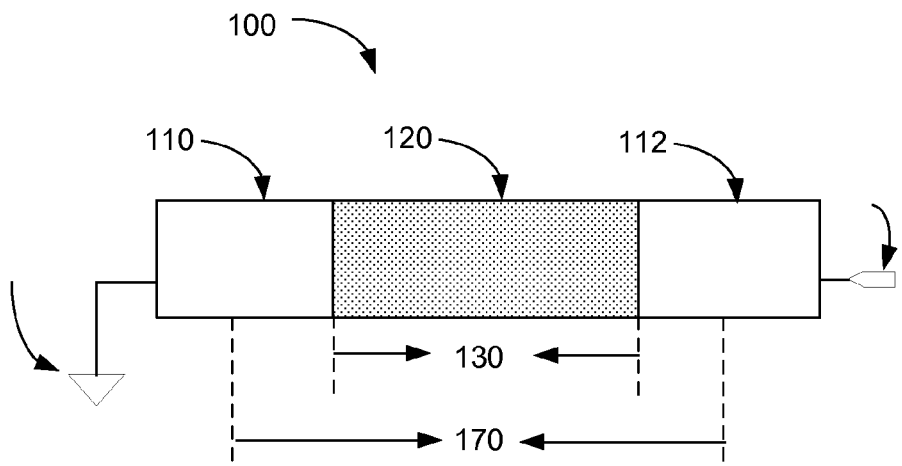
FIGS. 1A and 1B illustrate an exemplary device incorporating a voltage switchable dielectric material (VSDM).
Figure 1B:
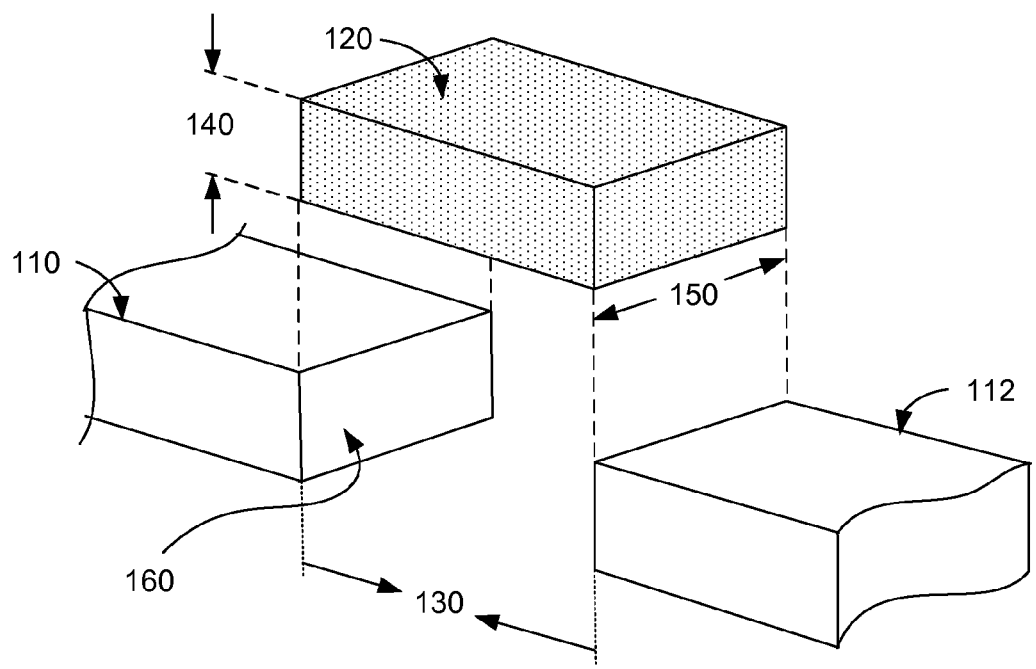

FIGS. 1A and 1B illustrate an exemplary device incorporating a voltage switchable dielectric material. Device 100 includes at least two conductive pads (or electrodes) 110 and 112, connected by VSDM 120. Typically, one pad (e.g., pad 110) is configured to be connected to ground, and another pad (e.g., pad 112) is configured to be connected to a component being protected (e.g., a circuit, chip, resistor, capacitor, inductor, diode, and the like). Device 100 may be characterized by a package spacing 170.

Under normal operating conditions VSDM 120 behaves as an insulator, and so current at normal voltages may not pass from pad 112 to pad 110. When the device being protected is exposed to a damaging electrical event (e.g., at a voltage above the switching voltage), VSDM 120 may be conductive, and current may be shunted through VSDM 120 and pad 110 to ground.

The electrical, thermal, and physical characteristics of VSDM 120 may be a function of the chemical composition of VSDM 120. The response (e.g., shunting behavior) of device 100 may also be a function of certain geometrical factors, including gap 130, gap height 140, and gap width 150. These dimensions may generally characterize a volume of VSDM through which current passes between pads. In the example shown in FIGS. 1A and 1B, a contact area 160 may describe an area of the conductive pad that contacts the VSDM 120, and through which current passes during a shunting event. Opposing pad 112 may include another contact area to VSDM 120. Current may pass substantially uniformly through the volume of VSDM 120 (essentially defined by gap 130, height 140, and gap width 150 in FIG. 1B). In some embodiments, current may pass nonuniformly through a volume of VSDM.

Figure 2:
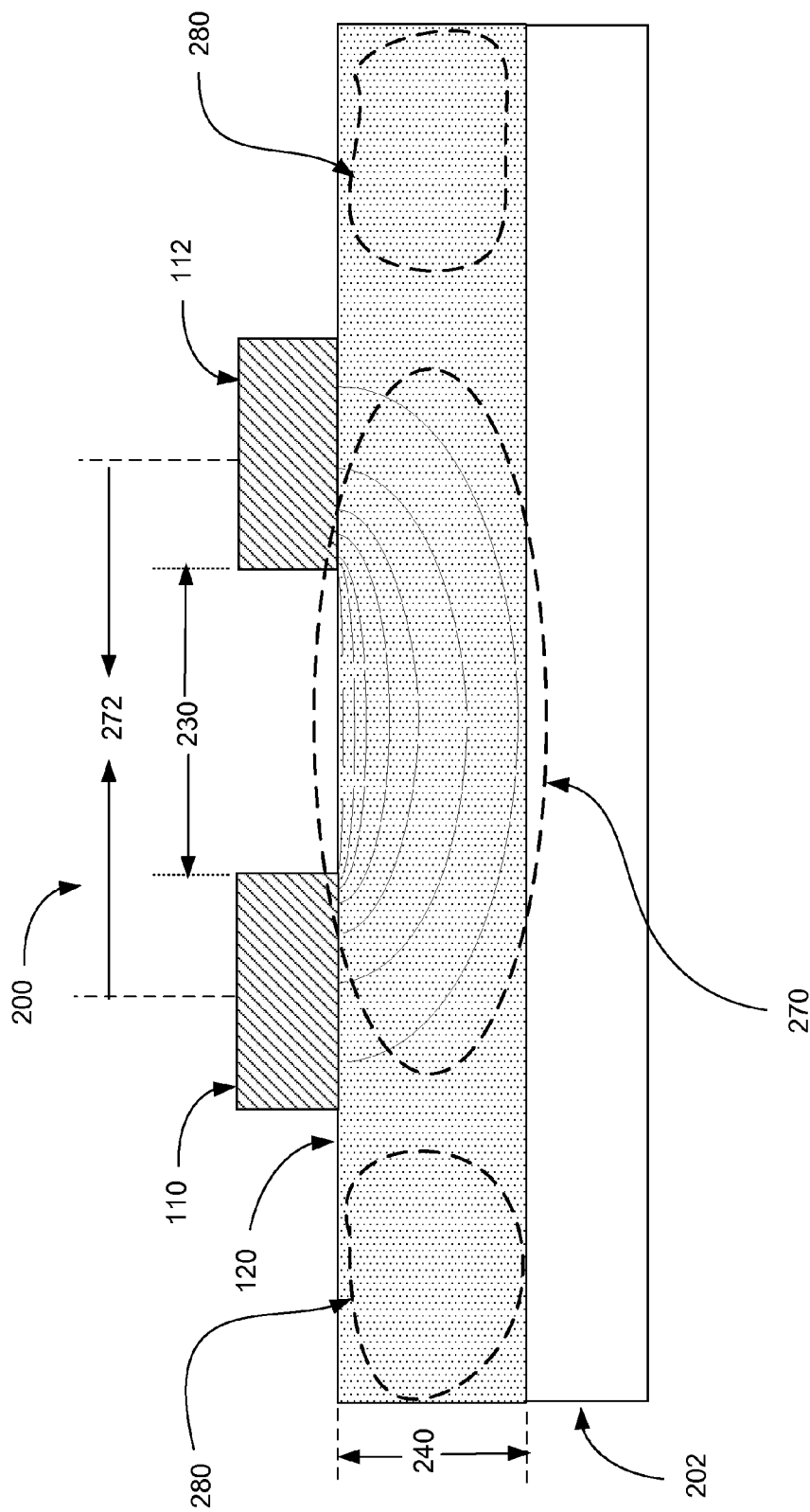
FIG. 2 is a schematic illustration of an active volume, according to some embodiments.

FIG. 2 is a schematic illustration of an active volume, according to some embodiments. Device 200 includes pads 110 and 112 separated by gap 230. In this example, pads 110 and 112 are disposed on and connected by VSDM 120, and VSDM 120 is disposed as a layer having a thickness 240, on a dielectric substrate 202. Device 200 may be characterized by a package spacing 272, and include a gap width normal to the page of FIG. 2. Some dielectric substrates may include a layer of fiber reinforcement pre-impregnated with resin (or "prepreg") as used in PCB fabrication. Some VSDM may be deposited on a substrate (e.g., spin coated, doctor bladed, sprayed, and the like).

Various devices (e.g., device 200) may be fabricated using lithography. For example, a printed circuit board substrate may include a VSDM layer beneath a copper layer, and conductive pads may be etched in the copper layer using lithographic techniques. In some embodiments, a mask may be applied to a VSDM layer and pads may be deposited (e.g., sputtered) through holes in the mask onto the VSDM layer. Lithographic fabrication may provide for geometries (e.g., gap, gap width, and the like) having improved tolerances as compared to devices fabricated using non-lithographic methods. In some embodiments, conductive pads, lines, vias, and the like may be fabricated using physical vapor deposition (PVD), chemical vapor deposition (CVD), electrochemical deposition (e.g., plating), electroless chemical deposition, and the like.

For some configurations, pads may be connected to VSDM in a manner that results in a variation of current density in different portions of the VSDM during shunting. For example, pads that are encapsulated in VSDM may be separated by a small gap. During shunting, a majority of current may directly traverse the gap, following the shortest route from one pad to the other pad. A smaller amount of current may follow a longer route (e.g., between portions of the pads that are separated by larger distances).

In device 200, current density through VSDM 120 during a shunting event may not be uniform with position. Certain portions of VSDM 120 (e.g., situated most closely "between" the pads and/or near the closest "corners" of pads 110 and 112) may carry more current than other portions situated farther away from the most direct connection between the pads.

Current density as a function of location in VSDM 120 may be calculated (e.g., using finite element modeling (FEM) methods), according to various parameters of the device (geometry of the pads, volume and shape of the VSDM, interfaces between the pads and the VSDM, and the like), and materials properties (e.g., composition of the VSDM such as polymer properties, fill particle properties, particle loading, thermal, electrical, mechanical properties of the phases, and the like) at a voltage and/or voltage profile associated with a given ESD event. An active volume may be defined as a volume of VSDM that carries at least a certain portion of current during a shunting event. An active volume may be chosen arbitrarily (e.g., according to an application), and may describe that volume of VSDM that carries a substantial portion (e.g., 30%, 50%, 70%, 90%, or more) of current. An active volume may be described empirically or qualitatively. In FIG. 2, active volume 270 may be generally associated with a region of VSDM 120 that carries a relatively larger amount of current between pads 110 and 112. Inactive volumes 280 may describe those regions of VSDM 120 that carry relatively little (or even none) of the current between pads 110 and 112.

Certain embodiments provide for increasing the ratio of active to inactive volume. In some applications, increasing the ratio of active volume to inactive volume may increase the proportion of VSDM that is actually shunting current during a shunting event. Increasing the ratio of active to inactive volume may provide for reducing an overall size of a device incorporating the VSDM.

For thin layers of VSDM, active volume may be increased by increasing thickness 240. Active volume may be increased by increasing gap 230, although some applications require tightly controlled electrical properties that may be substantially defined by gap 230 (i.e., gap 230 may be a "fixed parameter" according to a certain application). Certain applications provide for increasing active volume by increasing the gap width (i.e., in a direction normal to the plane of the page in FIG. 2, or alternately, gap width 150 in FIG. 1).

Figure 3:
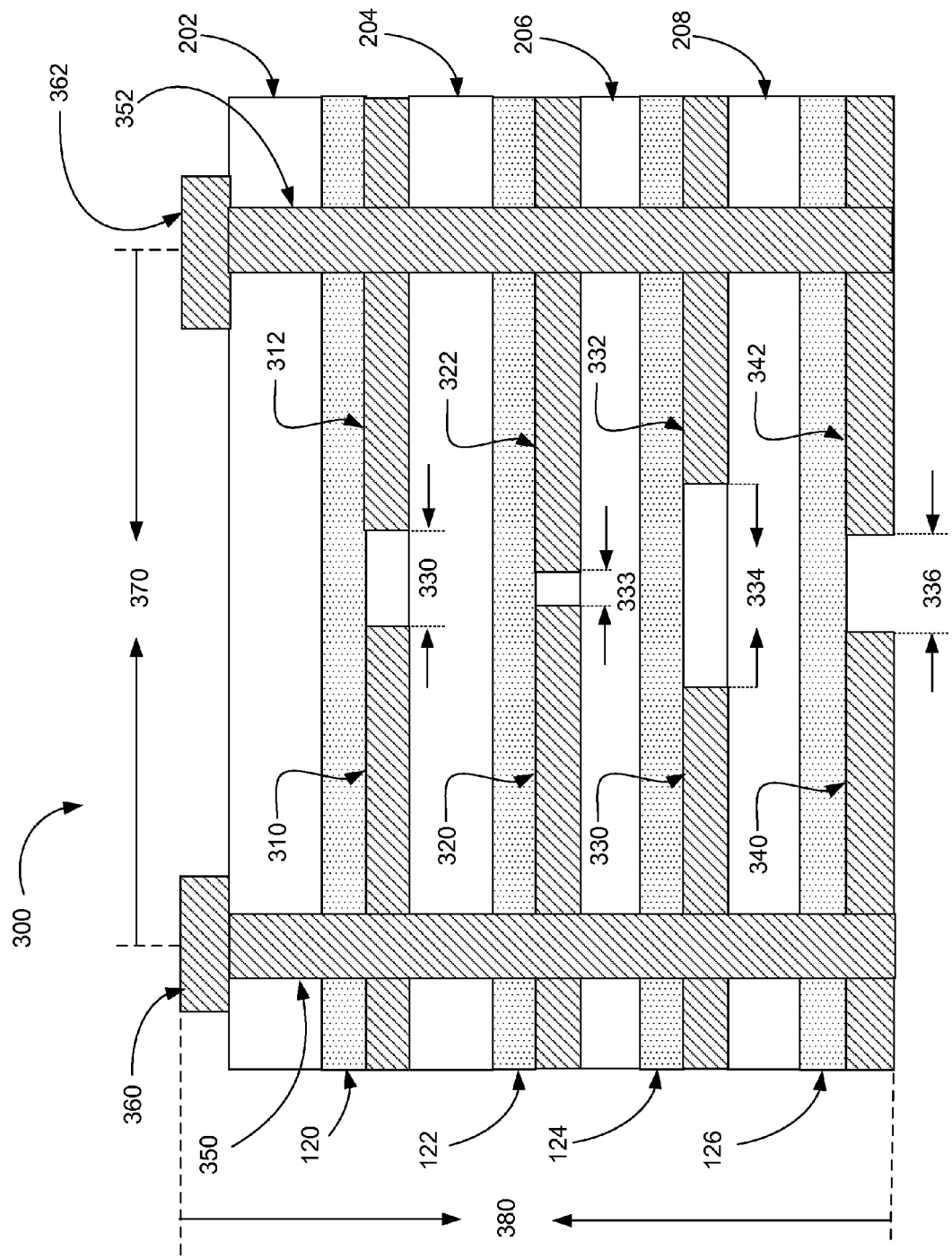
FIG. 3 illustrates a multilayer stack, according to some embodiments.

FIG. 3 illustrates a multilayer stack, according to some embodiments. In some implementations, gap width (normal to the page) may be increased by creating a plurality of gaps, with their respective pads connected in parallel as shown. In some cases, members of the plurality are disposed on different layers of a device. Device 300 may include VSDM layers 120, 122, 124, and 126. In some implementations, the same VSDM is used for each layer. In some implementations, different VSDMs are used in different layers. VSDM layers may be disposed on dielectric substrates. In the example shown in FIG. 3, device 300 may include a plurality of dielectric substrates 202, 204, 206, 208, which may be different or the same type of substrate.

VSDM 120 may connect pads 310 and 312 across gap 330. VSDM 122 may connect pads 320 and 322 across gap 333. VSDM 124 may connect pads 330 and 332 across gap 334. VSDM 126 may connect pads 340 and 342 across gap 336. Gaps in a device (e.g., gaps 330, 333, 334, 336) may have the same or different lengths.

A gap between pads may be between 1 and 1000 microns, including between 10 and 200 microns. Certain gaps between pads may be between 20 and 80 microns, including between 45 and 70 microns. Gaps may be fabricated (or defined between pads) using lithography. For some gaps, a tolerance on the distance between conductive pads may be within 20% of the distance. Some fabrication methods (e.g., glass mask lithography) may yield tolerances within 10% (e.g., +/−5 μm on a 50 μm gap). Some methods may yield tolerances within 5%, 1%, or even within 0.1%.

Conductive pads 310, 320, 330, and 340 may be electrically connected. In this example, these pads are connected by a conductive via 350 through the multilayer stack. Via 350 may connect to a conductive lead 360. Similarly, conductive pads 312, 322, 332, and 342 may be connected by via 352 to conductive lead 362.

A distance (e.g., a center-to-center distance) between leads 360 and 362 may be described as a package spacing, and may be defined by (or designed to fit with) a matching spacing to which device 300 may be attached. Device 300 may be characterized by a package spacing 370 between leads 360 and 362. In some embodiments, a package spacing may be between 50 microns and 1 cm, including between 250 microns and a 5 mm. Certain package spacings are in the range of 500 microns to 10 cm. A package spacing may be associated with a standard spacing (e.g., an Electronic Industries Alliance/EIA 481 standard, or an International Electrotechnical Commission/IEC standard). For example, an EIA standard surface mount device (SMD) type 0402 (1005 metric) device may be described by a package spacing of approximately 1 mm, and an 0603 device may be described by a package spacing of approximately 1.66 mm. A package spacing may be associated with a standardized surface mount technology (SMT) specification. A package spacing may characterize a dimension associated with any type of device, including but not limited to a two-terminal package (e.g., a 101005 device/400 microns; an 0201 device/600 microns; an 0805 device/2 mm; a 2010 device/5 mm; a 2512 device/6.35 mm) and the like. A package spacing may be associated with a spacing of a three terminal device (e.g., an SOT-223, an SOT-89, an SOT-723, an SOT-883, and the like). A package spacing may be associated with a spacing of a five, six, or even eight terminal device (e.g., an SOT-23-5, an SOT23-6, an SOT-23-8). A package spacing may be associated with a device having even higher pin counts (e.g., a dual in-line package, such as a SOIC, a TSOP, an SSOP, a TSSOP, a VSOP, and the like). A package spacing may be associated with a quad in-line package (e.g., a PLCC, a QFP, a TQFP, an LCC, an MLP, and the like). A package spacing may be associated with a grid array (e.g., a PGA, BGA, LGA, LFBGA, TFBGA, CGA, pBGA, LLP, and the like). A package spacing may be associated with a system on chip (SOC), system in package (SIP), chip on board (COB), chip on flex (COF), chip on glass (COG) and the like.

Certain applications may not have a practical restriction on a height of a device. Certain applications may have a specified maximum height of a device (e.g., in a direction normal to a surface to which the device may be attached). Device 300 may include a height 380, which may be chosen to be below a specified maximum height (if one exists). In some embodiments, 2, 5, 10, 20, 50, 100, or even 1000 layers may be used to create a multilayer stack. Gaps 330, 332, 334, and 336 include gap widths (normal to the page in FIG. 3); these gap widths may be the same or different lengths. The integrated gap width (or, the sum of the individual gap widths) may be greater than 50% of the package spacing. In some cases, the gap width (which may include the integrated gap width) may be greater than the package spacing, more than twice the package spacing, more than five times the package spacing, more than ten times the package spacing, or even more than fifty times the package spacing.

Figure 4:
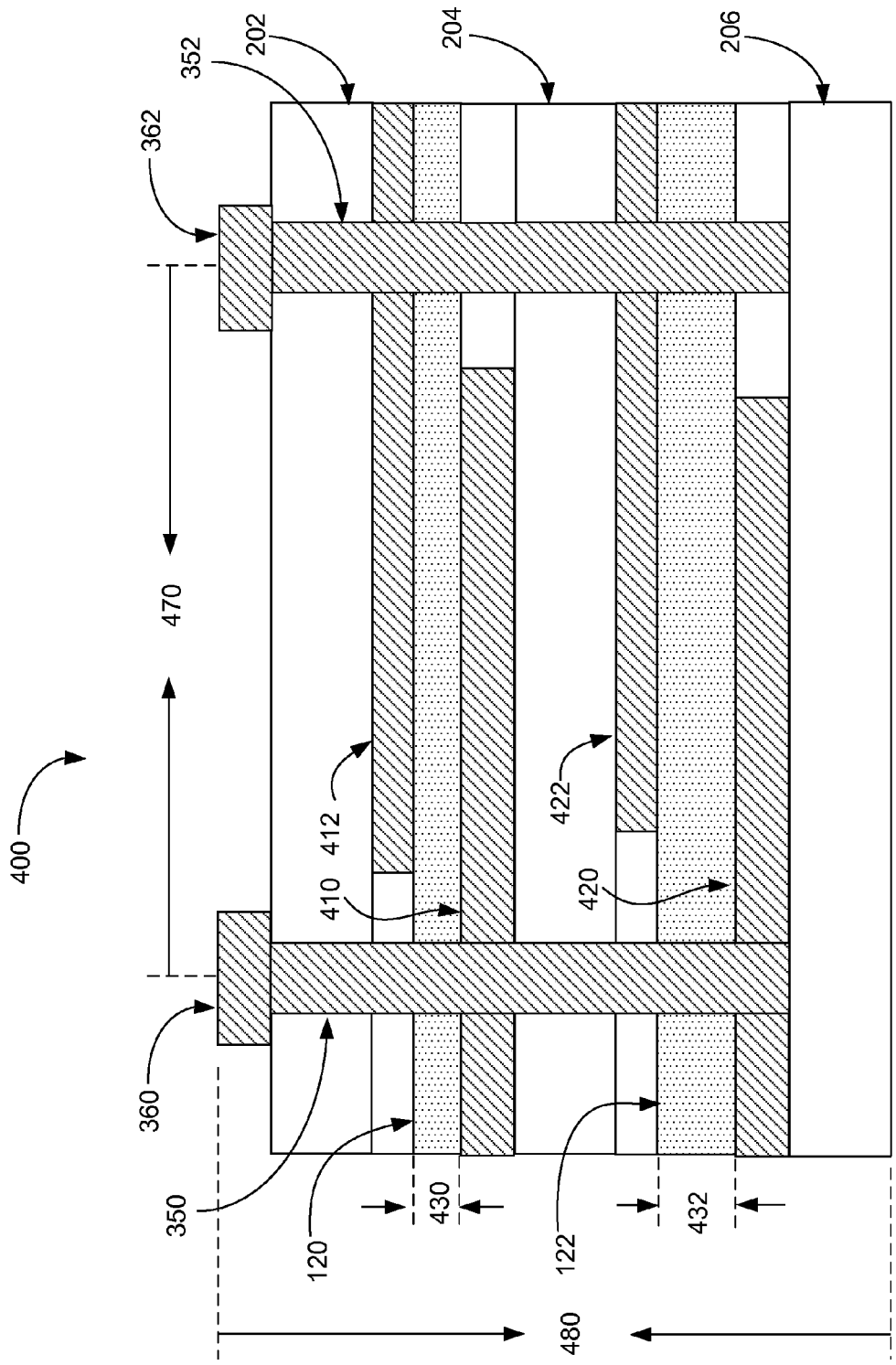
FIG. 4 illustrates a multilayer stack, according to some embodiments.

FIG. 4 illustrates a multilayer stack, according to some embodiments. Device 400 may include VSDM 120 and 122. VSDM 120 and 122 may be the same VSDM or different VSDM (e.g., having different compositions, fractions of various phases, clamp, trigger, and/or switching voltages, and the like). VSDM layers may be disposed on dielectric substrates. In the example shown in FIG. 4, device 400 may include a plurality of dielectric substrates 202, 204, and 206, which may be different or the same type of substrate.

VSDM 120 may connect pads 410 and 412 across gap 430. VSDM 122 may connect pads 420 and 422 across gap 432. Gaps in a multilayer stack (e.g., gaps 430 and 432) may have the same or different lengths.

Conductive pads 410 and 420 may be electrically connected. In this example, these pads are connected by via 350 through the multilayer stack. Via 350 may connect to a conductive lead 360. Similarly, conductive pads 412 and 422 may be connected by via 352 to conductive lead 362. Leads 360 and 362 may be separated by a package spacing 470, and a height of device 400 may be described by height 480.

Device 400 includes gaps 430 and 432 that are "vertically" oriented (e.g., the direction of the gap is parallel to vias 350 and 352). In some embodiments, a vertical gap may provide for an increased active volume. A gap width (normal to the page of FIG. 4) may be increased by increasing a number of layers (e.g., the number of discrete gaps) in a multilayer stack. Gap width may be increased by increasing the size of device 400 in a direction normal to the plane of FIG. 4 (e.g., increasing the contact area between the conductive pads and their respective VSDM.

Figure 5:
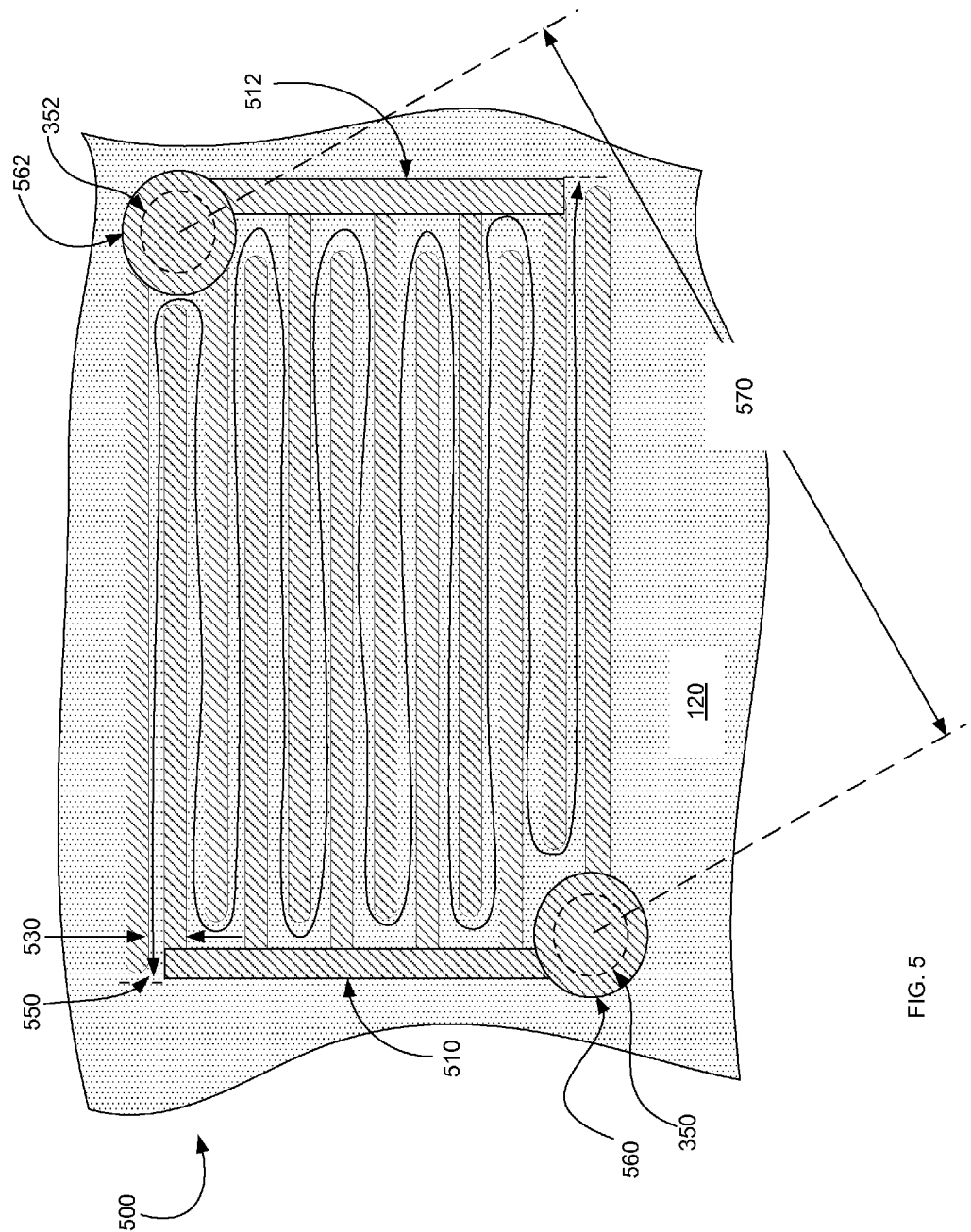
FIG. 5 illustrates an exemplary embodiment.

FIG. 5 illustrates an exemplary embodiment. Device 500 includes VSDM 120. VSDM 120 may optionally be disposed on a substrate (not shown). Conductive leads 560 and 562 are each in electrical communication with a conductive pad (and/or a plurality of conductive pads), and are separated by package spacing 570. Lead 560 may be in communication with pad 510, and lead 562 may be in communication with pad 512. Pads 510 and 512 may be disposed on and connected by VSDM 120 across gap 530, and their arrangement may be described as an interdigitated comb (according to the "digits" of the respective pads). Gap width 550, which may be described as the "length" or "pathway" through the comb's digits, may be larger than 50% of package spacing 570, and in some embodiments may be much larger (e.g., five, ten, hundreds, or even thousands of times larger) than package spacing 570.

A multilayer stack may have individual layers having elongated gap widths (e.g., a plurality of stacked devices 500). Optional vias 350 and 352 may be used to connect conductive pads and leads on various layers in a multilayer stack.

Figure 6:
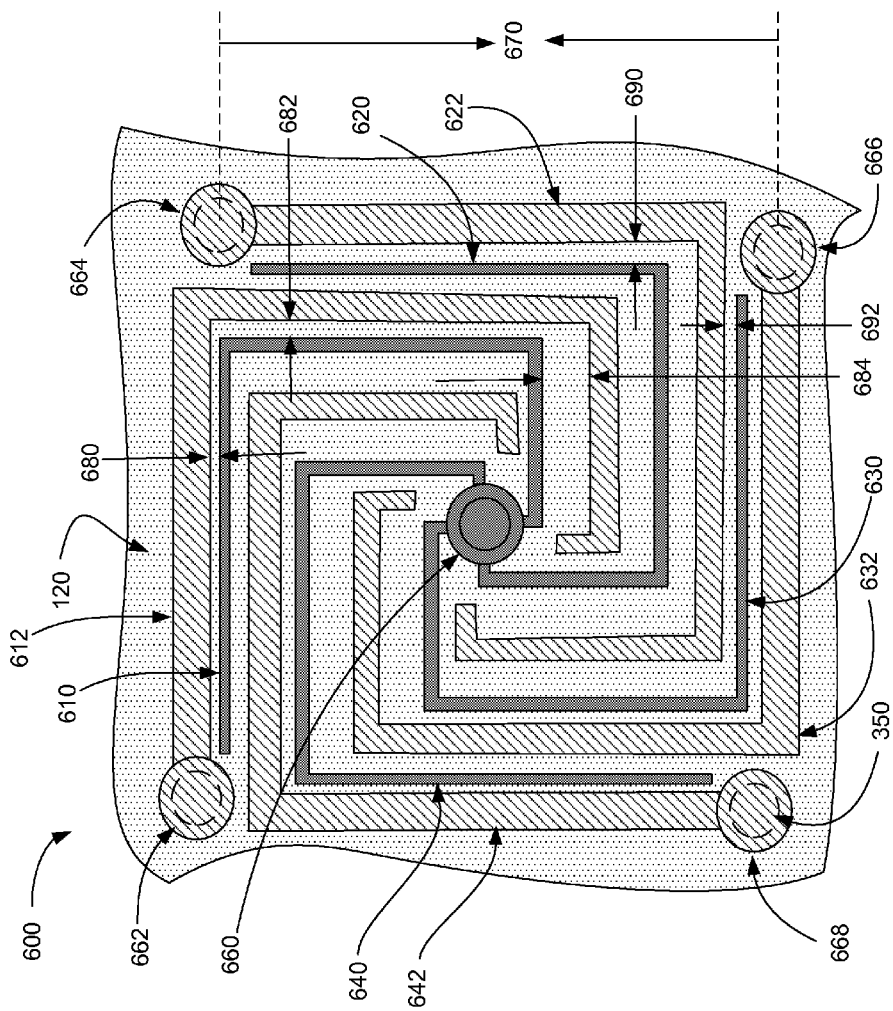
FIG. 6 illustrates an exemplary embodiment.

FIG. 6 illustrates an exemplary embodiment. Device 600 may provide protection (e.g., against ESD damage) for a plurality of sites (e.g., several bond pads) on an electronic component. Device 600 may provide protection for a plurality of components (e.g., each connected to a conductive lead of device 600). Device 600 includes VSDM 120, which may optionally be disposed on a substrate. A conductive lead 660 (e.g., a lead that may be connected to ground) may be in electrical communication with a plurality of conductive pads 610, 620, 630, and 640 (described as "ground pads" for convenience). Each of a plurality of device leads 662, 664, 666, 668 may be in electrical communication with its respective conductive pad 612, 622, 632, and 642 (described as "device pads" for convenience).

The ground pads and device pads may be in contact with (e.g., disposed on) VSDM 120. VSDM 120 may connect the ground pad to a device pad across one or more gaps. Pads may be connected (via VSDM 120) across multiple gaps. A device pad may connect (via VSDM 120) to one or more ground pads, and a ground pad may connect (via VSDM 120) to one or more device pads. For example, current may flow between device pad 612 and ground pad 610 via VSDM across gaps 680, 682, and 684 (which may be the same or different distances). Device pad 622 may connect (via VSDM 120) to ground pad 620 across gap 690, and to ground pad 630 across gap 692. For clarity, only exemplary illustrative gaps are shown in FIG. 6.

Various leads may be separated according to one or more package spacings. For clarity, only exemplary package spacing 670 is illustrated, which describes a distance between device leads 664 and 666. In various embodiments, gap widths (and/or integrated or summed gap widths) may be greater than 50% of one or more package spacings. Some embodiments include a multilayer stack with one or more layers of device 600. Various gap widths (e.g., integrated gap widths) may be greater than 50% of at least one package spacing.

Figure 7:
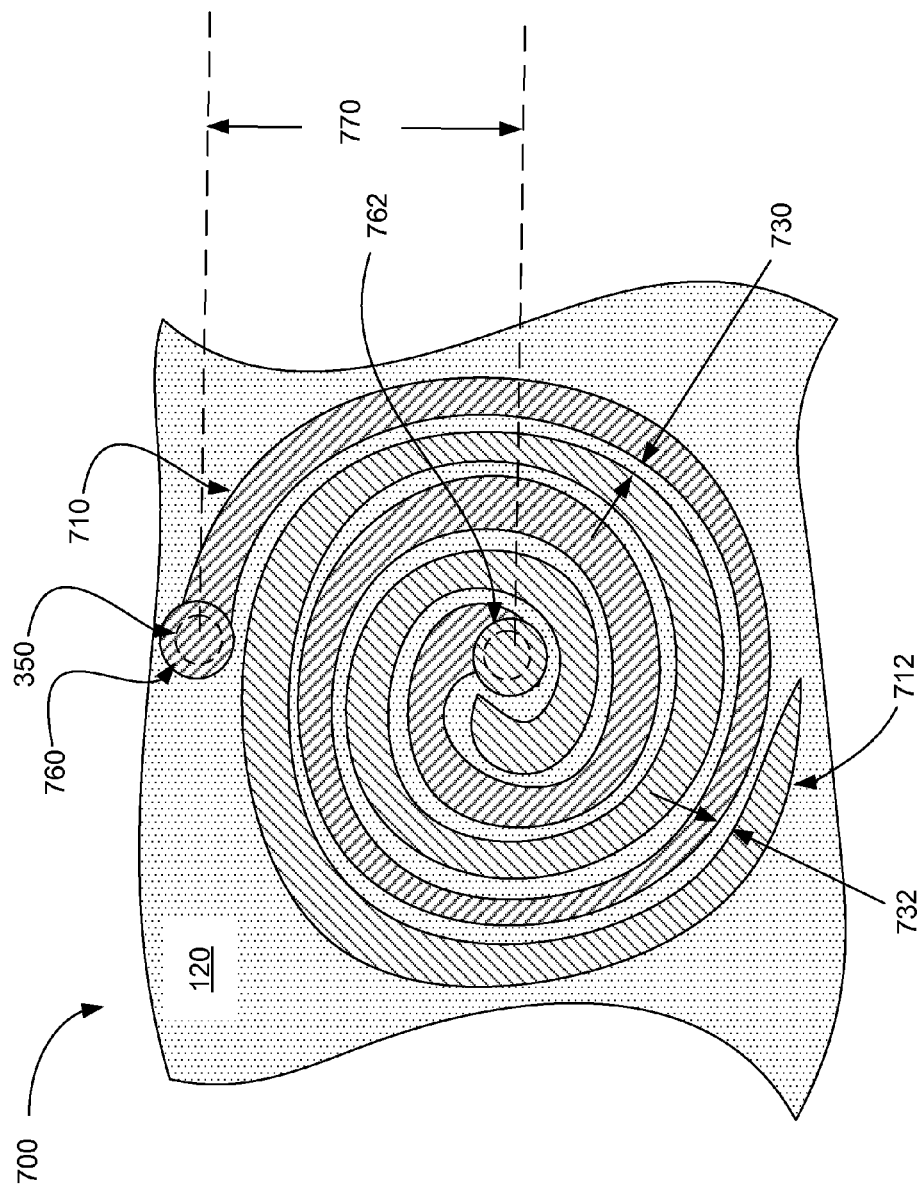
FIG. 7 illustrates an exemplary embodiment.

FIG. 7 illustrates an exemplary embodiment. Device 700 includes VSDM 120. VSDM 120 may optionally be disposed on a substrate (not shown). Conductive leads 760 and 762 are in electrical communication with conductive pads, and are separated by package spacing 770. Lead 760 may be in communication with pad 710, and lead 762 may be in communication with pad 712. Pads 710 and 712 may be disposed on and connected by VSDM 120 across one or more gaps. Exemplary gaps 730 and 732 are shown for illustrative purposes. Some embodiments include "curved" gaps, as shown in FIG. 7. Some embodiments include a multilayer stack with one or more layers of device 700. Various gap widths (e.g., integrated gap widths) may be greater than 50% of the package spacing. Gaps may be fabricated using lithography, electron-beam etching, selective deposition (e.g., atomic layer deposition on a silanated surface), chemical vapor deposition (which may be selective), physical vapor deposition (e.g., with a mask, photoresist, and the like), electrochemical deposition (which may include a seed layer), and the like.

Figure 8:
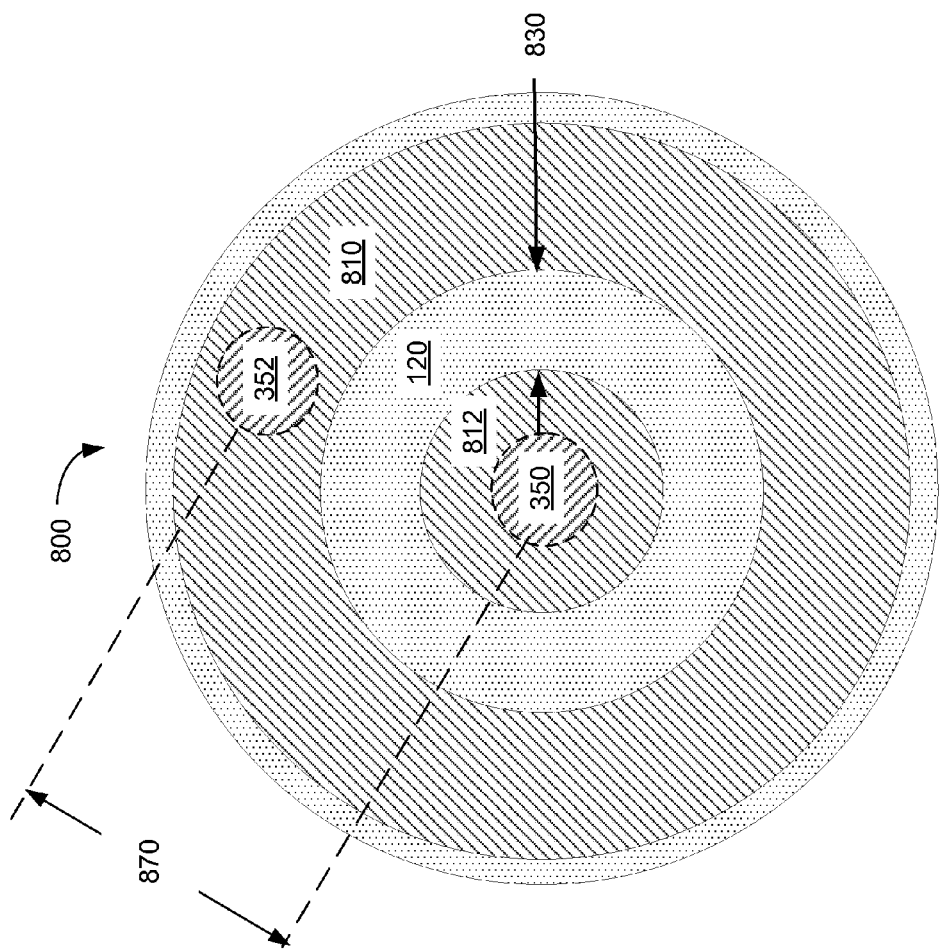
FIG. 8 illustrates an exemplary embodiment.

FIG. 8 illustrates an exemplary embodiment. Device 800 includes VSDM 120, which may be disposed on a substrate. Device 800 includes first conductive pad 810 and second conductive pad 812, separated by gap 830. Device 800 may be characterized by a package spacing 870, which may describe a distance between portions of conductive pads 810 and 812 (e.g., bond sites associated with these pads, or via landing sites associated with these pads). For illustrative clarity, optional vias 350 and 352 may be used to define package spacing 870. During an ESD event, current may pass between conductive pads 810 and 812 through VSDM 120 via gap 830. Leads (not shown) may be connected to the conductive pads to connect the pads to a ground, component, and the like.

Device 800 includes an annular gap between inner pad 812 and outer (coaxial) pad 810. Certain embodiments include pads (connected by VSDM) having contact areas (to the VSDM) that are different. During an ESD event, current may flow between two pads having different contact areas, which may create a different current density at a first pad as compared to the second pad. Some embodiments include a pad having a higher current density (e.g., a smaller pad) connected to a component being protected. Some embodiments include a pad having a lower current density (e.g., a larger pad) connected to an electronic component being protected. A multilayer stack may include one or more devices 800. In some embodiments, gap width may be described by a coaxial circle associated with gap 830. Gap width may vary with position (e.g., with radius as in device 800). In some cases, at least a portion of the gap width of a device 800 may be greater than 50% of package spacing 870.

The use of the terminology "lead," "pad," "via," and the like is for illustrative clarity only. These electrically conductive features may or may not be fabricated from different materials. These features may be substantially contiguous and/or interconnected discrete features.

Some embodiments include sensors to sense various parameters (e.g., thickness, strain, temperature, stress, viscosity, concentration, depth, length, width, thickness, number of layers, coefficient of thermal expansion (CTE), switching voltage and/or voltage density (between insulating and conducting), trigger voltage, clamp voltage, off-state current passage, dielectric constant, time, date, and other characteristics). Various apparatus may monitor various sensors, and systems may be actuated by automated controls (solenoid, pneumatic, piezoelectric, and the like). Some embodiments include a computer readable storage medium coupled to a processor and memory. Executable instructions stored on the computer readable storage medium may be executed by the processor to perform various methods described herein. Sensors and actuators may be coupled to the processor, providing input and receiving instructions associated with various methods. Certain instructions may provide for closed-loop control of various parameters via coupled sensors providing input and coupled actuators receiving instructions to adjust parameters. Certain embodiments include materials. Various embodiments may be associated with telephones (e.g., cell phones), USB-devices (e.g., a USB-storage device), personal digital assistants, iPods, iPads, laptop computers, netbook computers, tablet PC computers and the like.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A device incorporating a voltage switchable dielectric material (VSDM), the device comprising:

first and second conductive leads separated by a package spacing; the first lead electrically connected to a first conductive pad;

the second lead electrically connected to a second conductive pad;

the first and second conductive pads separated by a first gap, the first gap having a first gap width greater than 50% of the package spacing;

a first VSDM bridging the first gap and connecting the first and second conductive pads;

a third conductive pad electrically connected to the first lead;

a fourth conductive pad electrically connected to the second lead;

the third and fourth conductive pads separated by a second gap; and a second VSDM connecting the first and second conductive pads via the second gap.

2. The device of claim 1, wherein the first gap width is greater than the package spacing.

3. The device of claim 1, wherein the first gap width is greater than two times the package spacing.

4. The device of claim 1, wherein the first gap width is greater than five times the package spacing.

5. The device of claim 1, wherein the first gap width is greater than ten times the package spacing.

6. The device of claim 1,
wherein the second VSDM has a different composition than the first VSDM.

7. The device of claim 1, wherein the device includes a multilayer stack, the first and second VSDM are disposed on different layers of the multilayer stack, and the conductive pads are electrically connected to their respective leads by conductive vias through the multilayer stack.

8. The device of claim 1, wherein the first and second VSDM have different thicknesses.

9. The device of claim 1, wherein the first and second VSDM have different electrical properties.

10. The device of claim 1, wherein the first and second gaps have different gap widths.

11. The device of claim 1, wherein the first and second gaps have different lengths.

12. The device of claim 1, wherein the package spacing is between 200 microns and 8,000 microns.

13. The device of claim 1, wherein the package spacing corresponds to a distance between electrical connection points associated with any of an EIA 0201, 0402, and 0603 device.

14. The device of claim 1, wherein the first gap width is between 500 and 5000 microns.

15. The device of claim 1, wherein any of the pads, leads, and first gap is fabricated using lithography.

16. The device of claim 15, wherein the gap is characterized by a tolerance on a distance between the pads that is within 20% of the value of the distance.

17. The device of claim 16, wherein the tolerance is within 10%.

18. The device of claim 1, wherein the first gap is between 10 and 100 microns long.

19. The device of claim 1, further comprising a dielectric substrate, wherein the first VSDM is disposed as a first layer on the dielectric substrate and the first and second conductive pads are disposed as a second layer on the first VSDM.

20. The device of claim 19, wherein the substrate includes a layer of prepreg, and the conductive pads include copper.

21. The device of claim 1, further comprising a third conductive lead electrically connected to a fifth conductive pad, the fifth conductive pad attached to the first VSDM and separated from any of the first and second conductive pads by a third gap.

22. The device of claim 1, further comprising a fifth conductive pad attached to the first VSDM, the fifth conductive pad separated from any of the first and second conductive pads by a third gap, the fifth conductive pad electrically connected to either the first or second conductive lead.

* * * * *